(12) United States Patent
Horiuchi et al.

(10) Patent No.: US 7,733,714 B2
(45) Date of Patent: Jun. 8, 2010

(54) MIS-TRANSISTOR-BASED NONVOLATILE MEMORY FOR MULTILEVEL DATA STORAGE

(75) Inventors: Tadahiko Horiuchi, Isehara (JP); Kenji Noda, Fukuoka (JP)

(73) Assignee: NScore Inc., Fukuoka (JP)

( * ) Notice: Subject to any disclaimer, the term of this patent is extended or adjusted under 35 U.S.C. 154(b) by 141 days.

(21) Appl. No.: 12/139,550

(22) Filed: Jun. 16, 2008

(65) Prior Publication Data
US 2009/0310428 A1    Dec. 17, 2009

(51) Int. Cl.
*G11C 7/00* (2006.01)
(52) U.S. Cl. .......................... 365/189.12; 365/189.05; 365/191; 365/189.09
(58) Field of Classification Search ............ 365/189.12, 365/189.05, 191, 189.09
See application file for complete search history.

(56) References Cited

U.S. PATENT DOCUMENTS

| | | | |
|---|---|---|---|
| 3,636,530 A | 1/1972 | Mark et al. | |
| 4,419,744 A | 12/1983 | Rutter | |
| 5,956,269 A | 9/1999 | Ouyang et al. | |
| 6,038,168 A | 3/2000 | Allen et al. | |
| 6,064,590 A | 5/2000 | Han et al. | |
| 6,373,738 B1 * | 4/2002 | Towler et al. | 365/49.1 |
| 6,740,927 B1 | 5/2004 | Jeng | |
| 6,906,953 B2 | 6/2005 | Forbes | |
| 6,906,962 B2 | 6/2005 | Layman et al. | |
| 6,909,635 B2 | 6/2005 | Forbes et al. | |
| 7,227,234 B2 | 6/2007 | Roizen et al. | |
| 2004/0232477 A1 | 11/2004 | Iwata et al. | |
| 2004/0252554 A1 | 12/2004 | Fournel et al. | |
| 2009/0213650 A1 * | 8/2009 | Noda | 365/184 |

FOREIGN PATENT DOCUMENTS

| | | |
|---|---|---|
| JP | 06-076582 | 3/1994 |
| JP | 06-231587 | 8/1994 |
| JP | 2001-156188 | 6/2001 |
| JP | 2002-237540 | 8/2002 |
| WO | WO2004/057621 | 7/2004 |
| WO | WO2006/093629 | 9/2006 |

* cited by examiner

*Primary Examiner*—Thong Q Le
(74) *Attorney, Agent, or Firm*—IPUSA, PLLC

(57) ABSTRACT

A memory circuit includes a latch having a first node and a second node to store data such that a logic level of the first node is an inverse of a logic level of the second node, a MIS transistor having a gate node, a first source/drain node, and a second source/drain node, the first source/drain node coupled to the first node of the latch, and a control circuit configured to control the gate node and second source/drain node of the MIS transistor to make an upward lingering change in a threshold voltage of the MIS transistor in a first operation in response to data stored in the latch and to make a downward lingering change in the threshold voltage in a second operation in response to data stored in the latch.

10 Claims, 10 Drawing Sheets

MIS-TRANSISTOR-BASED NONVOLATILE MEMORY FOR MULTILEVEL DATA STORAGE

BACKGROUND OF THE INVENTION

1. Field of the Invention

The disclosures herein generally relate to a memory circuit, and particularly relate to a nonvolatile memory circuit which is capable of retaining stored data in the absence of a power supply voltage.

2. Description of the Related Art

PermSRAM is a new type of nonvolatile semiconductor memory device, which uses a MIS (metal-insulating film-semiconductor) transistor as a nonvolatile memory cell (i.e., the basic unit of data storage). The MIS transistor used as a nonvolatile memory cell in PermSRAM has the same structure as ordinary MIS transistors used for conventional transistor functions (e.g., switching function), and do not require a special structure such as a floating gate or a special material such as a ferroelectric material or ferromagnetic material. The absence of such a special structure and special material offers an advantage in cost reduction. PermSRAM was initially disclosed in PCT/JP2003/016143, which was filed on Dec. 17, 2003, the entire contents of which are hereby incorporated by reference.

The MIS transistor used as a nonvolatile memory cell in PermSRAM is configured to experience an irreversible hot-carrier effect on purpose for storage of one-bit data. Here, the irreversible hot-carrier effect refers to the injection of carriers into the oxide film (insulating film) and/or sidewalls, which causes a change in the transistor's threshold voltage. Whether the threshold voltage has been changed due to a hot-carrier effect represents one-bit data "0" or "1". Such a change in the threshold voltage may be detected by sensing a difference in ON current between the nonvolatile-memory-cell MIS transistor and a reference MIS transistor by using a sensing circuit such as a latch circuit.

Data supplied from an external source to a PermSRAM may be initially written to the latch circuit. A store operation is then performed to transfer the data from the latch circuit to the nonvolatile-memory-cell MIS transistor. Whether the nonvolatile-memory-cell MIS transistor experiences a hot-carrier effect in the store operation depends on whether the data stored in the latch circuit is 0 or 1. A recall operation is subsequently performed to read the data stored in the nonvolatile-memory-cell MIS transistor. If the nonvolatile-memory-cell MIS transistor has experienced a hot-carrier effect in the store operation, an ON current smaller than the ON current of the reference MIS transistor may be detected in the recall operation. If the nonvolatile-memory-cell MIS transistor has not experienced a hot-carrier effect in the store operation, an ON current larger than the reference ON current may be detected in the recall operation. The latch circuit may be used as a sense circuit to sense such difference in ON current, and latches data that is either "0" or "1" depending on whether the ON current of the nonvolatile-memory-cell MIS transistor is larger or smaller than the reference ON current.

Carriers trapped in the oxide film and/or sidewalls of a MIS transistor due to a hot carrier effect include both electrons and holes. In general, an electron having enough kinetic energy in a semiconductor material can knock a bound electron out of its bound state to create an electron-hole pair. This phenomenon is known as impact ionization. In a case of an NMOS transistor, hot electrons having high-kinetic energy flowing through a transistor channel from the source to the drain causes impact ionization to occur at the channel/drain junction to create electron-hole pairs. Such impact ionization also occurs in a PMOS transistor. That is, holes having high-kinetic energy causes impact ionization at the channel/drain junction of a PMOS transistor to create electron-hole pairs. Depending on the condition under which the transistor is driven, either electrons or holes become predominant carriers that are trapped in the oxide film and/or sidewalls of the MIS transistor as the result of a hot carrier effect.

If properly configured, PermSRAM may be able to select either electrons or holes as predominant carriers thereby to control a polarity of change in the threshold voltage.

SUMMARY OF THE INVENTION

It is a general object of the present invention to provide a memory circuit that substantially eliminates one or more shortcomings of the related art.

It is another and more specific object of at least one embodiment of the present invention to provide a memory circuit that can select either electrons or holes as predominant carriers thereby to control a polarity of change in the threshold voltage.

According to one aspect, a memory circuit includes a latch having a first node and a second node to store data such that a logic level of the first node is an inverse of a logic level of the second node, a MIS transistor having a gate node, a first source/drain node, and a second source/drain node, the first source/drain node coupled to the first node of the latch, and a control circuit configured to control the gate node and second source/drain node of the MIS transistor to make an upward lingering change in a threshold voltage of the MIS transistor in a first operation in response to data stored in the latch and to make a downward lingering change in the threshold voltage in a second operation in response to data stored in the latch.

According to at least one embodiment, voltages applied to the gate and source/drain nodes of the MIS transistor are controlled to select either electrons or holes as predominant carriers. This makes it possible to control a polarity of change in the threshold voltage

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

The disclosures herein are directed to PermSRAM. Namely, the memory cell transistors are MIS (metal-insulating film-semiconductor) transistors that have the same structure as ordinary MIS transistors used for conventional transistor functions (e.g., switching function). These memory cell transistors use neither a special structure such as a floating gate nor a special material such as a ferroelectric material or a ferromagnetic material. These MIS transistors are configured to selectively experience a hot-carrier effect on purpose for storage of data. The hot-carrier effect leaves an irreversible lingering change in the transistor characteristics to the MIS transistors. A change in the transistor characteristics caused by the hot-carrier effect achieves nonvolatile data retention.

In the following description, PMOS transistors are used as an example of the nonvolatile-memory-cell MIS transistors, but such examples are not intended to be limiting. NMOS transistors may alternatively be used as nonvolatile-memory-cell transistors.

Figure 1:
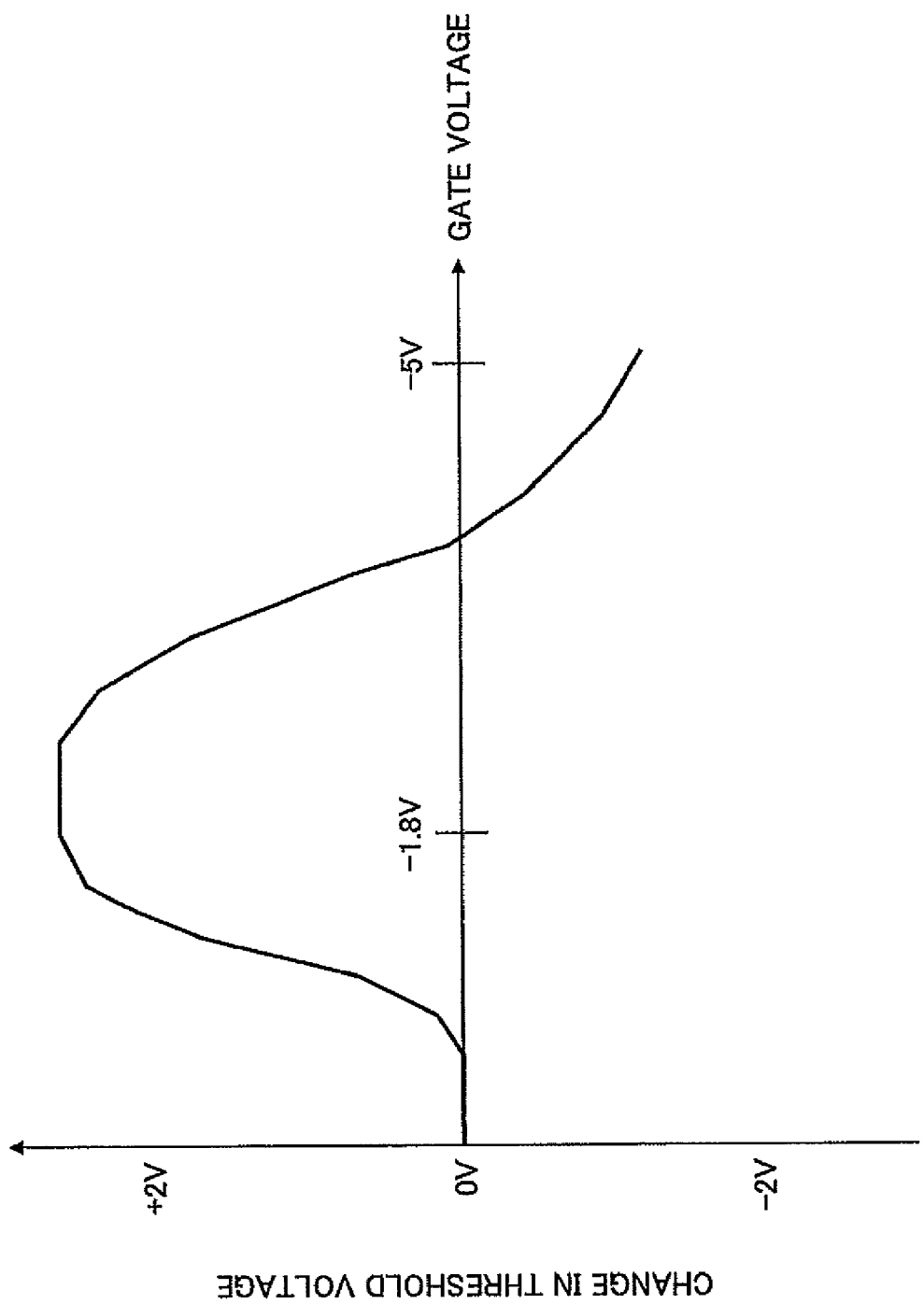
FIG. 1 is a drawing showing changes in the threshold voltage in response to changes in the applied gate voltage in the case of an enhancement-type PMOS transistor.

FIG. 1 is a drawing showing changes in the threshold voltage in response to changes in the applied gate voltage in the case of an enhancement-type PMOS transistor. The horizontal axis represents a voltage applied to the gate of an enhancement-type PMOS transistor, and the vertical axis represents a change in the threshold voltage of the enhancement-type PMOS transistor that is caused by a hot carrier effect. The source node and drain node are set to 0 V and −5 V, respectively, to cause the hot carrier effect.

As shown in FIG. 1 an upward change in the threshold voltage is a maximum when the applied gate voltage is approximately −1.8 V. Here, the term "upward change" means a shift of the threshold voltage in the positive direction. With an upward change in the threshold voltage, thus, an ON current of the PMOS transistor increases for a constant voltage applied between the source node and the gate node. In this case, electrons are predominant carriers trapped in the oxide film and/or sidewalls as the result of a hot carrier effect. This upward change is a lingering change that achieves nonvolatile retention.

Figure 2:
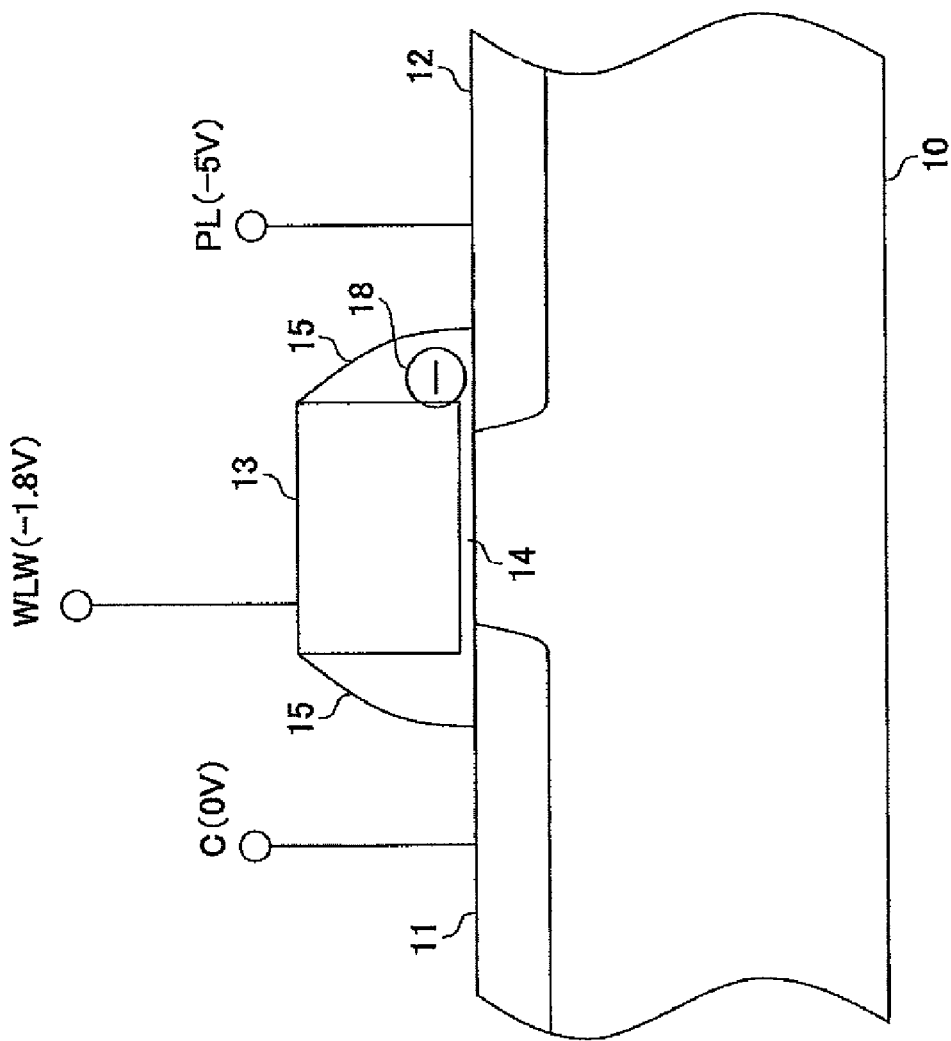
FIG. 2 is a cross-sectional view of a PMOS transistor having experienced a hot carrier effect.

FIG. 2 is a cross-sectional view of a PMOS transistor having experienced a hot carrier effect. A P-type diffusion layer 11 and a P-type diffusion layer 12 are formed in an N-type substrate 10 to serve as the source C and drain PL of a transistor. A gate electrode 13 is formed on the N-type substrate 10 at the position of the channel between the source and the drain, with an oxide film 14 (insulating film) intervening between the gate electrode 13 and the N-type substrate 10. Sidewalls 15 are disposed on the lateral faces of the gate electrode 13.

When the source node C and drain node PL are set to 0 V and −5 V, respectively, to cause a hot carrier effect, the application of −1.8 V to a gate node WLW causes electrons 18 trapped in the oxide film 14 and/or the sidewalls 15. It should be noted that the injection of electrons 18 by the hot-carrier effect is localized around the drain node PL of the PMOS transistor, i.e., near the P-type diffusion layer 12. Because of this localized nature, it is possible to store another data through the injection of carriers on the other side of the channel near the P-type diffusion layer 11, as will be described later.

Referring to FIG. 1 again, a large downward change in the threshold voltage is detected when the applied gate voltage is −5.0 V. Here, the term "downward change" means a shift of the threshold voltage in the negative direction. With a downward change in the threshold voltage, thus, an ON current of the PMOS transistor decreases for a constant voltage applied between the source node and the gate node. In this case, holes are predominant carriers trapped in the oxide film and/or sidewalls as the result of a hot carrier effect. This downward change is a lingering change that achieves nonvolatile retention.

Figure 3:
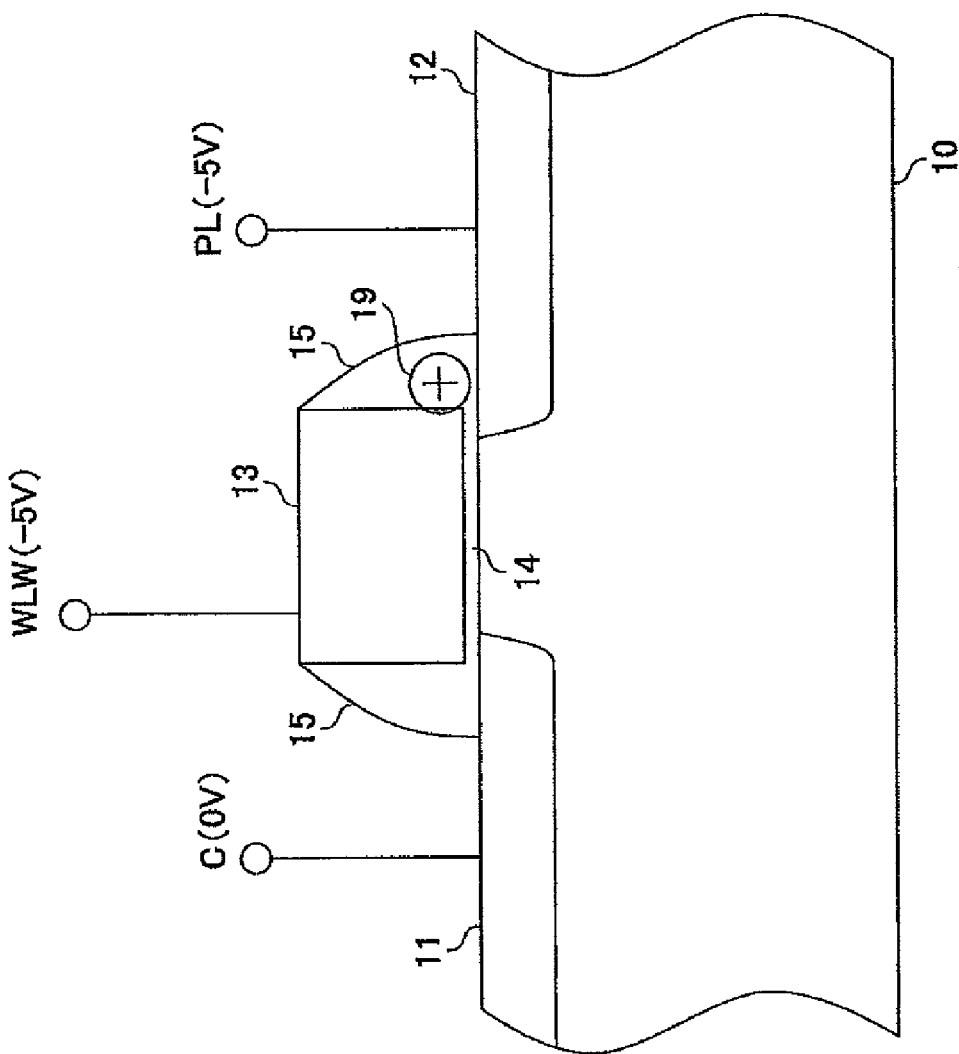
FIG. 3 is a cross-sectional view of a PMOS transistor having experienced a hot carrier effect.

FIG. 3 is a cross-sectional view of a PMOS transistor having experienced a hot carrier effect. In FIG. 3, the same elements as those of FIG. 2 are referred to by the same numerals, and a description thereof will be omitted. When the source node C and drain node PL are set to 0 V and −5 V, respectively, to cause a hot carrier effect, the application of −5.0 V to the gate node WLW causes holes 19 trapped in the oxide film 14 and/or the sidewalls 15. It should be noted that the injection of holes 19 by the hot-carrier effect is localized around the drain node PL of the PMOS transistor, i.e., near the P-type diffusion layer 12. Because of this localized nature, it is possible to store more data through the injection of carriers on the other side of the channel near the P-type diffusion layer 11 as will be described later.

Figure 4:
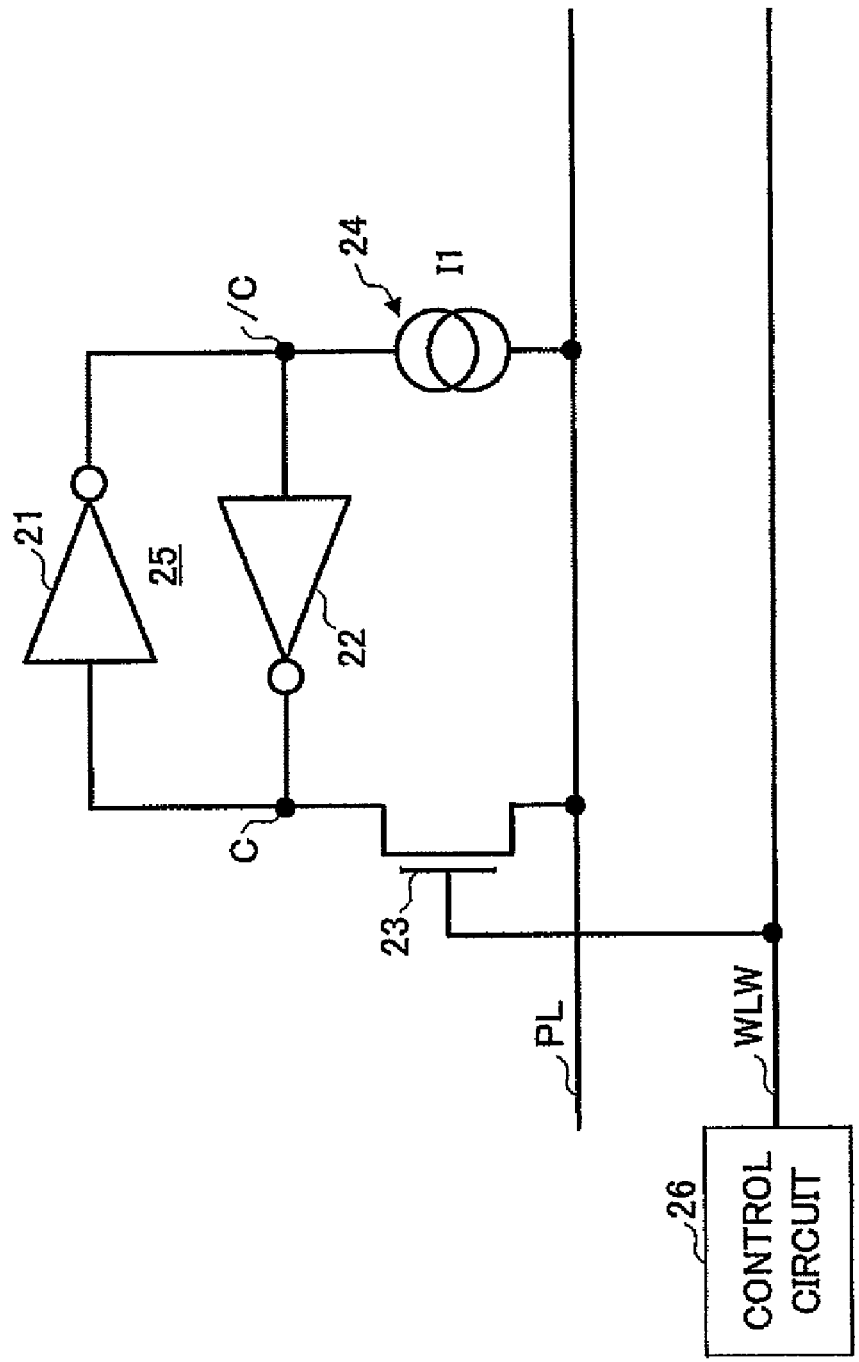
FIG. 4 is a circuit diagram showing an example of a memory circuit utilizing a nonvolatile-memory-cell MIS transistor.

FIG. 4 is a circuit diagram showing an example of a memory circuit utilizing the nonvolatile-memory-cell MIS transistor as described above. A memory circuit shown in FIG. 4 includes an inverter 21, an inverter 22, a PMOS transistor 23, and a constant current source 24. The PMOS transistor 23 is a nonvolatile-memory-cell MIS transistor.

The gate node of the PMOS transistor 23 is coupled to a word selecting line WLW. A control circuit 26 controls the voltage of the word selecting line WLW. One of the source/drain nodes of the PMOS transistor 23 is coupled to a plate line PL, and the other is coupled to an electrical node C. One end of the constant current source 24 is coupled to the plate line PL to supply an electric current I1 to the plate line PL. The other end of the constant current source 24 is coupled to an electrical node /C (the symbol "/" preceding another symbol indicates an inverse of the latter symbol) to draw the electric current I1 from the electrical node /C. Each of the inverters 21 and 22 has the output thereof coupled to the input of one another, thereby forming a latch (flip-flop circuit) 25. The electrical node C and electrical node /C of the latch 25 have respective bi-stable potentials whose logic levels are the complement of each other. It should be noted that the control circuit 26 may further be configured to control the plate line PL and the latch 25 to perform a data write operation and data read operation as will be described in the following.

Figure 5:
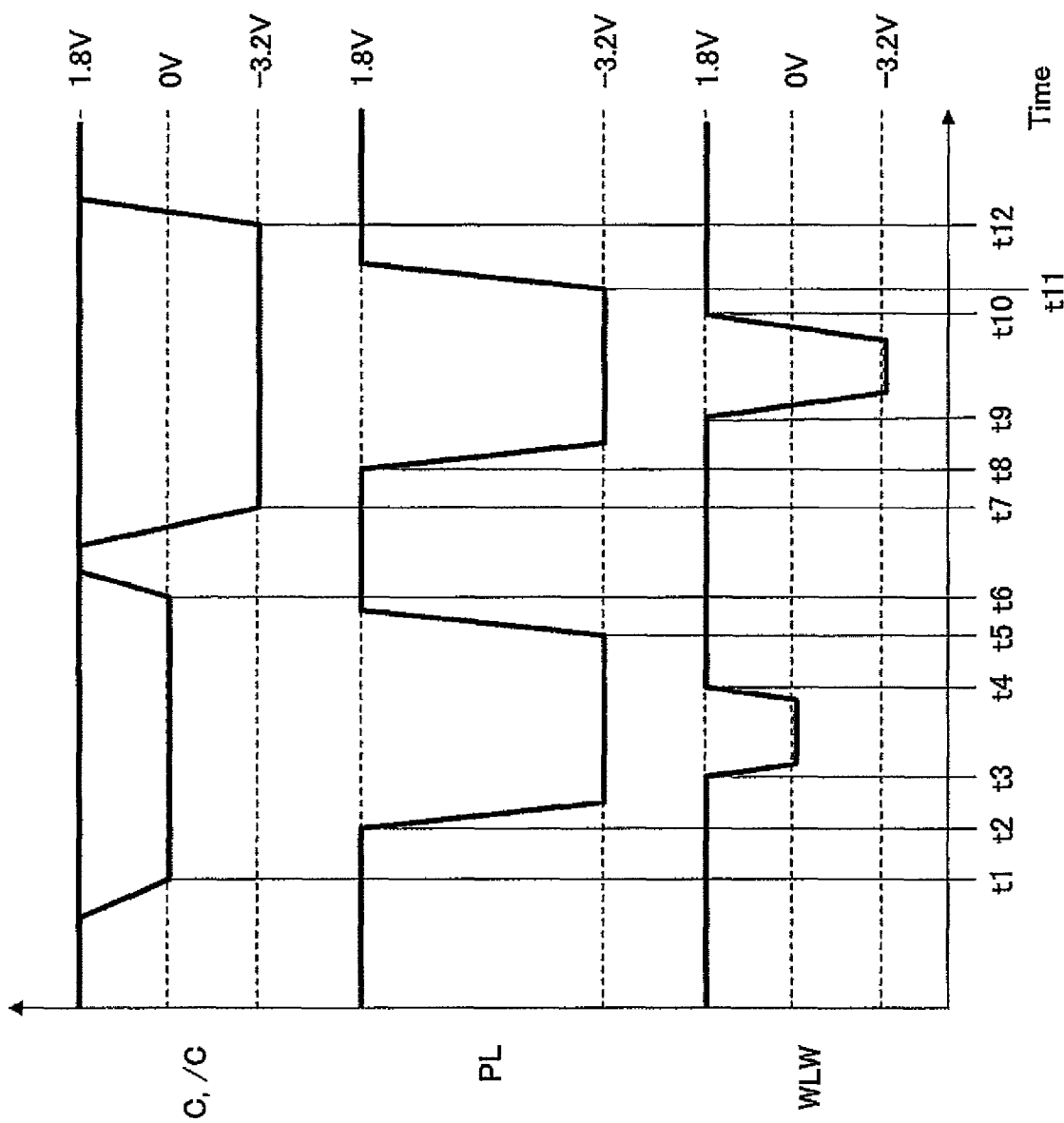
FIG. 5 is a drawing showing signal waveforms corresponding to a data write operation of the memory circuit shown in FIG. 4.

FIG. 5 is a drawing showing signal waveforms corresponding to a data write operation of the memory circuit shown in FIG. 4. The PMOS transistor 23 of the memory circuit shown in FIG. 4 can store three different values that correspond to a downward change, no change, and an upward change in the threshold voltage, respectively. In the following, a downward change, no change, and an upward change are referred to as data "0", "1", and "2", respectively, for the sake of convenience of explanation. In order to store a selected one of these three different values, two write operations are performed in FIG. 5. During the write operations, the constant current source 24 is placed in an inactive state.

In the first write operation, data is written at timing t1 to the latch 25 from an external source, so that one of the nodes C and /C is set to 1.8 V and the other is set to 0 V. The logic level "HIGH" corresponds to 1.8 V, and the logic level "LOW" corresponds to 0 V. Which one of the nodes C and /C is set to HIGH depends on the data to be written to the PMOS transistor 23. If data "2" (corresponding to an upward change in the threshold voltage) is to be written, the node C is set to HIGH (=1.8 V). Otherwise, the node C is set to LOW (=0 V).

At timing t2, the potential of the plate line PL is changed from 1.8 V to −3.2 V. At timing t3, the potential of the word selecting line WLW is changed from 1.8 V to 0 V. If the node C is HIGH (=1.8 V in the first write operation), the PMOS transistor 23 becomes conductive to allow the passage of electric current. If the node C is LOW (=0 V in the first write operation), the PMOS transistor 23 becomes nonconductive so as not to allow the passage of electric current.

In the case where the node C is HIGH, the gate node, source node, and drain node of the PMOS transistor 23 are set to 0 V, 1.8 V, and −3.2 V, respectively. These settings are equivalent to the settings in which the gate node, source node, and drain node are set to −1.8 V, 0 V, and −5.0 V, respectively, which in turn corresponds to the settings shown in FIG. 2. Consequently, the injection of electrons into the oxide film 14 and/or sidewalls 15 occurs around the drain node. Such injection of electrons causes an upward change in the threshold voltage.

In the case where the node C is LOW, the gate node, source node, and drain node are set to 0 V, 0 V, and −3.2 V, respectively. Because the gate potential and the source potential are the same, the PMOS transistor 23 is not conductive. No hot carrier effect occurs in this case, and no carriers are injected into the oxide film 14 or the sidewalls 15.

In the second write operation, data is written at timing t7 to the latch 25 from the external source, so that one of the nodes C and /C is set to 1.8 V and the other is set to −3.2 V. The logic level "HIGH" corresponds to 1.8 V, and the logic level "LOW" corresponds to −3.2 V. Which one of the nodes C and /C is set to HIGH depends on the data to be written to the PMOS transistor 23. If data "0" (corresponding to a downward change in the threshold voltage) is to be written, the node C is set to HIGH (=1.8 V). Otherwise, the node C is set to LOW (=−3.2 V).

At timing t8, the potential of the plate line PL is changed from 1.8 V to −3.2 V. At timing t9, the potential of the word selecting line WLW is changed from 1.8 V to −3.2 V. If the node C is HIGH (=1.8 V in the second write operation), the PMOS transistor 23 becomes conductive to allow the passage of electric current. If the node C is LOW (=−3.2 V in the second write operation), the PMOS transistor 23 becomes nonconductive so as not to allow the passage of electric current.

In the case where the node C is HIGH, the gate node, source node, and drain node of the PMOS transistor 23 are set to −3.2 V, 1.8 V, and −3.2 V, respectively. These settings are equivalent to the settings in which the gate node, source node, and drain node are set to −5.0 V, 0 V, and −5.0 V, respectively, which in turn corresponds to the settings shown in FIG. 3. Consequently, the injection of holes into the oxide film 14 and/or sidewalls 15 occurs around the drain node. Such injection of holes causes a downward change in the threshold voltage.

In the case where the node C is LOW, the gate node, source node, and drain node are set to −3.2 V, −3.2 V, and −3.2 V, respectively. Because the gate potential and the source potential are the same, the PMOS transistor 23 is not conductive. No hot carrier effect occurs in this case, and no carriers are injected into the oxide film 14 or the sidewalls 15.

Through the first and second write operations as described above, a selected one of the values "0", "1", and "2" is stored in the PMOS transistor 23 as one of a downward change, no change, and an upward change of the threshold voltage, respectively. The values "0", "1", and "2" correspond to the injection of holes, no injection, and the injection of electrons, respectively. The value "0" can be stored by successively setting the node C to LOW and HIGH in the first and second write operations, respectively. The value "1" can be stored by successively setting the node C to LOW and LOW in the first and second write operations, respectively. The value "2" can be stored by successively setting the node C to HIGH and LOW in the first and second write operations, respectively. Such settings of the node C may be performed by providing two successive data bits from the external source.

Figure 6:
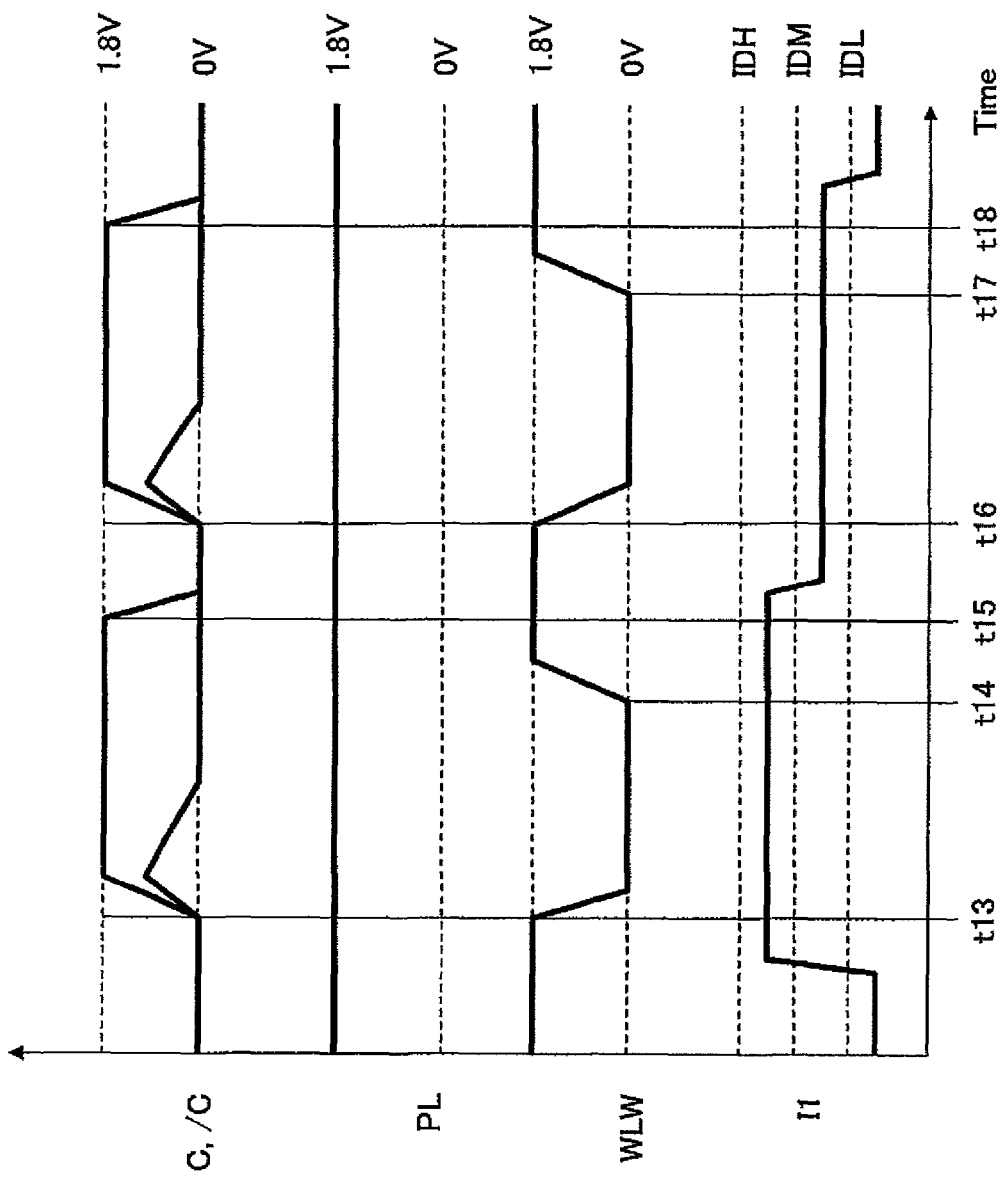
FIG. 6 is a drawing showing signal waveforms corresponding to a data read operation of the memory circuit shown in FIG. 4.

FIG. 6 is a drawing showing signal waveforms corresponding to a data read operation of the memory circuit shown in FIG. 4. As described above, the PMOS transistor 23 of the memory circuit shown in FIG. 4 stores one of the three different values "0", "1", and "2". The stored value can be identified by detecting the amount of electric current flowing through the PMOS transistor 23 in the conductive state. The gate node, source node, and drain node may be set to 0 V, 1.8 V, and 0 V, respectively, to place the PMOS transistor 23 in the conductive state. In the following, the PMOS transistor 23 with the stored values "0", "1", and "2" in such a conductive state allows the passage of a current amount IDL, IDM, IDH, respectively. The current amount IDL is smaller than IDM, which is smaller than IDH as shown in FIG. 6.

A read procedure shown in FIG. 6 is comprised of two read operations. The first read operation is performed from timing t13 to timing t15, and the second read operation is performed from timing 16 to timing t18. There is a first initial-setting period prior to timing t13. In this first initial-setting period, the nodes C and /C are set to 0 V, and the plate line PL is set to 1.8 V. In order to set the nodes C and /C to 0 V, the power supply voltage to the inverter 21 and the inverter 22 may be turned off to place the latch 25 in an inactive state. Further, during the first initial setting period, the constant current source 24 shown in FIG. 4 is turned on to set I1 at a point between IDH and IDM as shown in FIG. 6.

After the settings described above are made, at timing t13, the word selecting line WLW is set to 0 V to make the PMOS transistor 23 conductive. Also at timing t13, the latch (sense circuit) 25 comprised of the inverters 21 and 22 is activated. If the data stored in the PMOS transistor 23 is "2", the drain current running through the PMOS transistor 23 is IDH. In this case, the current flowing toward the node C is larger than the reference current I1 flowing toward the node /C. As a result, the latch 25 is placed in such a state that the nodes C and /C are set to HIGH and LOW, respectively. If the data stored in the PMOS transistor 23 is other than "2", the nodes C and /C are set to LOW and HIGH, respectively.

There is a second initial-setting period between t15 and t16. In this second initial-setting period, the nodes C and /C are set to 0 V, and the plate line PL is set to 1.8 V. During this period, further, the constant current source 24 shown in FIG. 4 is turned on to set I1 at a point between IDL and IDM as shown in FIG. 6.

After the settings described above are made, at timing t16, the word selecting line WLW is set to 0 V to make the PMOS transistor 23 conductive. Also at timing t16, the latch (sense circuit) 25 comprised of the inverters 21 and 22 is activated. If the data stored in the PMOS transistor 23 is "0", the drain current running through the PMOS transistor 23 is IDL. In this case, the current flowing toward the node C is smaller than the reference current I1 flowing toward the node /C. As a result, the latch 25 is placed in such a state that the nodes C and /C are set to LOW and HIGH, respectively. If the data stored in the PMOS transistor 23 is other than "0", the nodes C and /C are set to HIGH and LOW, respectively.

Through these two read operations, the data stored in the PMOS transistor 23, which is one of the values "0", "1", and "2", can be read by using the latch 25 as a sense circuit. The node C is successively set to LOW and LOW in the first and second read operations, respectively, in the case of stored data "0". The node C is successively set to LOW and HIGH in the first and second read operations, respectively, in the case of stored data "1". The node C is successively set to HIGH and HIGH in the first and second read operations, respectively, in the case of stored data "2". These two successive logic levels of the node C may be supplied to an external device to indicate what the stored data is.

A logic circuit or controller may be provided to encode or transform the two successive logic levels obtained at the time of read operation into a code that could be more suitable for an intended system design. Alternatively, a logic circuit or controller may be provided to encode or transform two successively supplied bits from an external source at the time of a write operation. This logic circuit or controller may be configured such that the two successive write bits are identical to the two successive read bits. For example, two successive write bits "1" and "1" at the time of write operation causes the storage of "2", which is read as two successive read bits having the same bit pattern "1" and "1" at the time of the read operation.

As was previously described in connection with FIG. 2 and FIG. 3, the injection of carriers (electrons and holes) into the oxide film and/or sidewalls is generally localized around the drain of the transistor. It follows that one three-level value can be stored at one end node of the channel, and another three-level value can be stored at the other end node of the channel. Storage of two three-level values in one transistor can be performed by switching nodes used as the drain in write operations. Namely, the use of one of the source/drain nodes as the drain during a given write operation enables the storage of one three-level value in the transistor, and the use of the other one of the source/drain nodes as the drain during another write operation enables the storage of another three-level value in the same transistor.

It should be noted that the two three-level values stored at the two ends of the channel can be selectively read by a read operation. During the read operation, the closer the trapped carriers are located to the source node, the stronger the effect of the trapped carriers is at the time of data reading. Namely, a read operation may be configured to use a first end of the channel as the source. Such a read operation can read the three-level value stored at the first end of the channel. Alternatively, a read operation may be configured to use a second end of the channel as the source. Such a read operation can read the three-level value stored at the second end of the channel.

Figure 7:
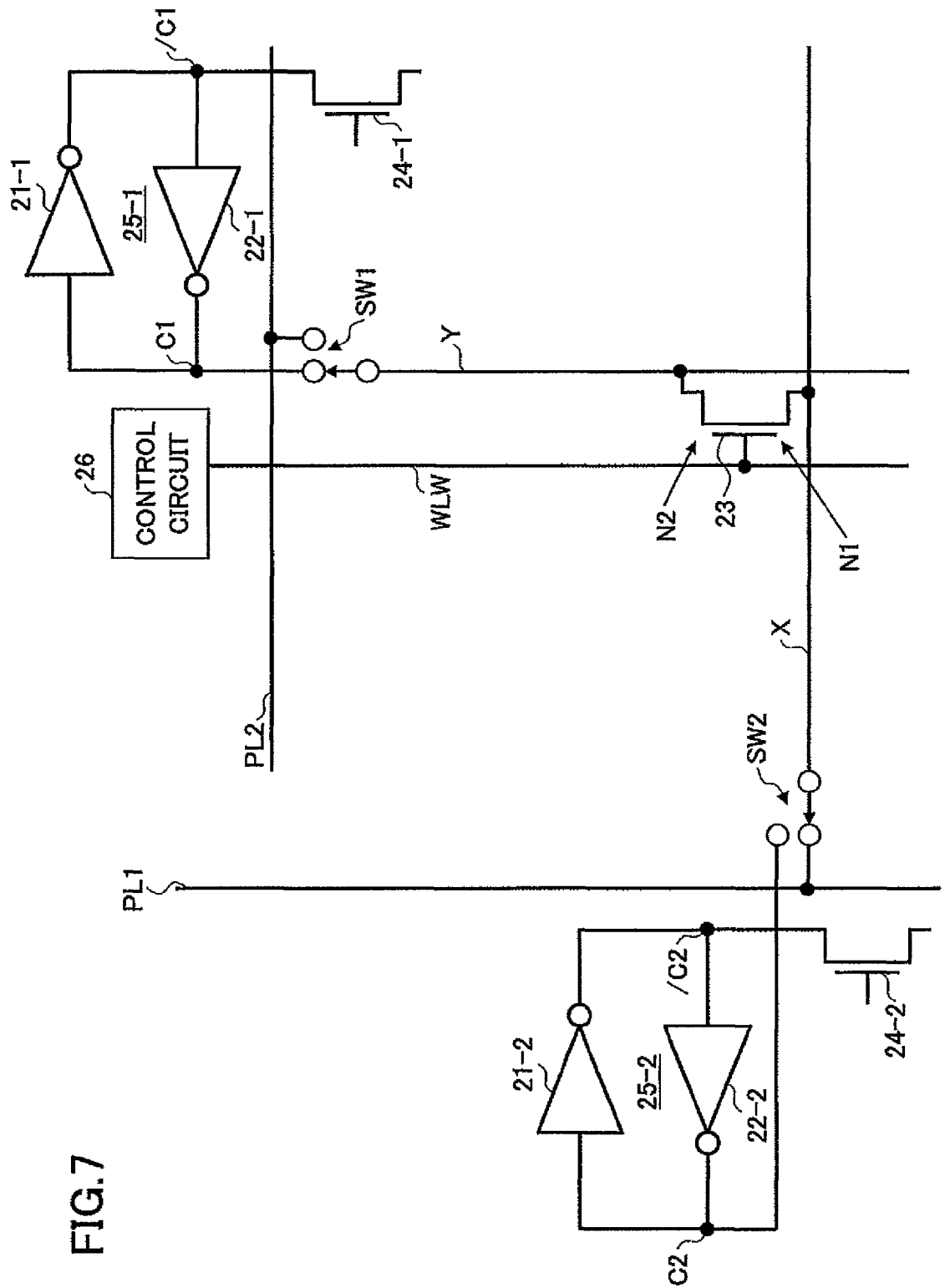
FIG. 7 is a drawing showing a memory circuit that can store two three-level values in one MIS transistor.

FIG. 7 is a drawing showing a memory circuit that can store two three-level values in one MIS transistor. In FIG. 7, the same elements as those of FIG. 4 are referred to by the same numerals, and a description thereof will be omitted.

One end (which is designated as an end node N2) of the channel of the PMOS transistor 23 is coupled to a latch 25-1 via a bit line Y and a switch SW1. The bit line Y extends in a first direction (e.g., vertical direction). The other end (which is designated as an end node N1) of the channel of the PMOS transistor 23 is coupled to a latch 25-2 via a bit line X and a switch SW2. The bit line X extends in a second direction (e.g., horizontal direction) substantially perpendicular to the first direction.

The latch 25-1 includes the inverters 21-1 and 22-1, and the latch 25-2 includes the inverters 21-2 and 22-2. Each of the latches 25-1 and 25-2 functions in the same way and achieves the same results as does the latch 25 described in connection with FIG. 4. The switch SW1 selectively couples the bit line Y to either a node C1 of the latch 25-1 or the plate line PL2. The switch SW2 selectively couples the bit line X to either a node C2 of the latch 25-2 or the plate line PL1. These switch circuits provides a first connection mode and a second connection mode.

In order to write a three-level value to the PMOS transistor 23 at the end node N1, the switch SW1 couples the bit line Y to the node C1 of the latch 25-1, and the switch SW2 couples the bit line X to the plate line PL1. This connection state is referred to as a first connection mode. Placed in the first connection mode, the memory circuit shown in FIG. 7 is subjected to the write operation as shown in FIG. 5. The plate line PL1 serves as the plate line PL shown in FIG. 5, and the nodes C1 and /C1 serve as the nodes C and /C shown in FIG. 5. As a result, the PMOS transistor 23 stores a three-level value at the end node N1 serving as the drain. The value of the stored data is determined by two successive logic levels of the node C1 as previously described in connection with FIG. 5.

In order to write a three-level value to the PMOS transistor 23 at the end node N2, the switch SW2 couples the bit line X to the node C2 of the latch 25-2, and the switch SW1 couples the bit line Y to the plate line PL2. This connection state is referred to as a second connection mode. Placed in the second connection mode, the memory circuit shown in FIG. 7 is subjected to the write operation as shown in FIG. 5. The plate line PL2 serves as the plate line PL shown in FIG. 5, and the nodes C2 and /C2 serve as the nodes C and /C shown in FIG. 5. As a result, the PMOS transistor 23 stores a three-level value at the end node N2 serving as the drain. The value of the stored data is determined by two successive logic levels of the node C2 as previously described in connection with FIG. 5.

In order to read a three-level value from the end node N1 of the PMOS transistor 23, the switch SW1 couples the bit line Y to the node C1 of the latch 25-1, and the switch SW2 couples the bit line X to the plate line PL1. Placed in these settings, the memory circuit shown in FIG. 7 is subjected to the read operation as shown in FIG. 6. The plate line PL1 serves as the plate line PL shown in FIG. 6, and the nodes C1 and /C1 serve as the nodes C and /C shown in FIG. 6. Further, a PMOS transistor 24-1 serves as the constant current source 24 shown in FIG. 4 to provide the current I1 shown in FIG. 6. As a result, a three-level value stored at the end node N1 of the PMOS transistor 23 serving as the source is read to the latch 25-1. The value of the read data is determined by two successive logic levels of the node C1 as previously described in connection with FIG. 6.

In order to read a three-level value from the end node N2 of the PMOS transistor 23, the switch SW2 couples the bit line X to the node C2 of the latch 25-2, and the switch SW1 couples the bit line Y to the plate line PL2. Placed in these settings, the memory circuit shown in FIG. 7 is subjected to the read operation as shown in FIG. 6. The plate line PL2 serves as the plate line PL shown in FIG. 6, and the nodes C2 and /C2 serve as the nodes C and /C shown in FIG. 6. Further, a PMOS transistor 24-2 serves as the constant current source 24 shown in FIG. 4 to provide the current I1 shown in FIG. 6. As a result, a three-level value stored at the end node N2 of the PMOS transistor 23 serving as the source is read to the latch 25-2. The value of the read data is determined by two successive logic levels of the node C2 as previously described in connection with FIG. 6.

In this manner, a single MIS transistor can store two three-level values independently of each other. This means that a nine-level value (=3×3) can be stored in a single MIS transistor.

It should be noted that the configuration shown in FIG. 7 is not intended to be limiting in any manner. For example, a single common latch may be used to substitute for the latches 25-1 and 25-2. Because only one of the latches 25-1 and 25-2 is used at a time, such a single common latch can serve to achieve the functions of the latches 25-1 and 25-2. By the same token, a single common plate line may be used to substitute for the plate lines PL1 and PL2. Because only one of the plate lines PL1 and PL2 is used at a time, such a single common plate line can serve to achieve the functions of the plate lines PL1 and PL2. In such a configuration, switch circuits may be provided to achieve swapping between the first end of the channel and the second end of the channel.

Figure 8:
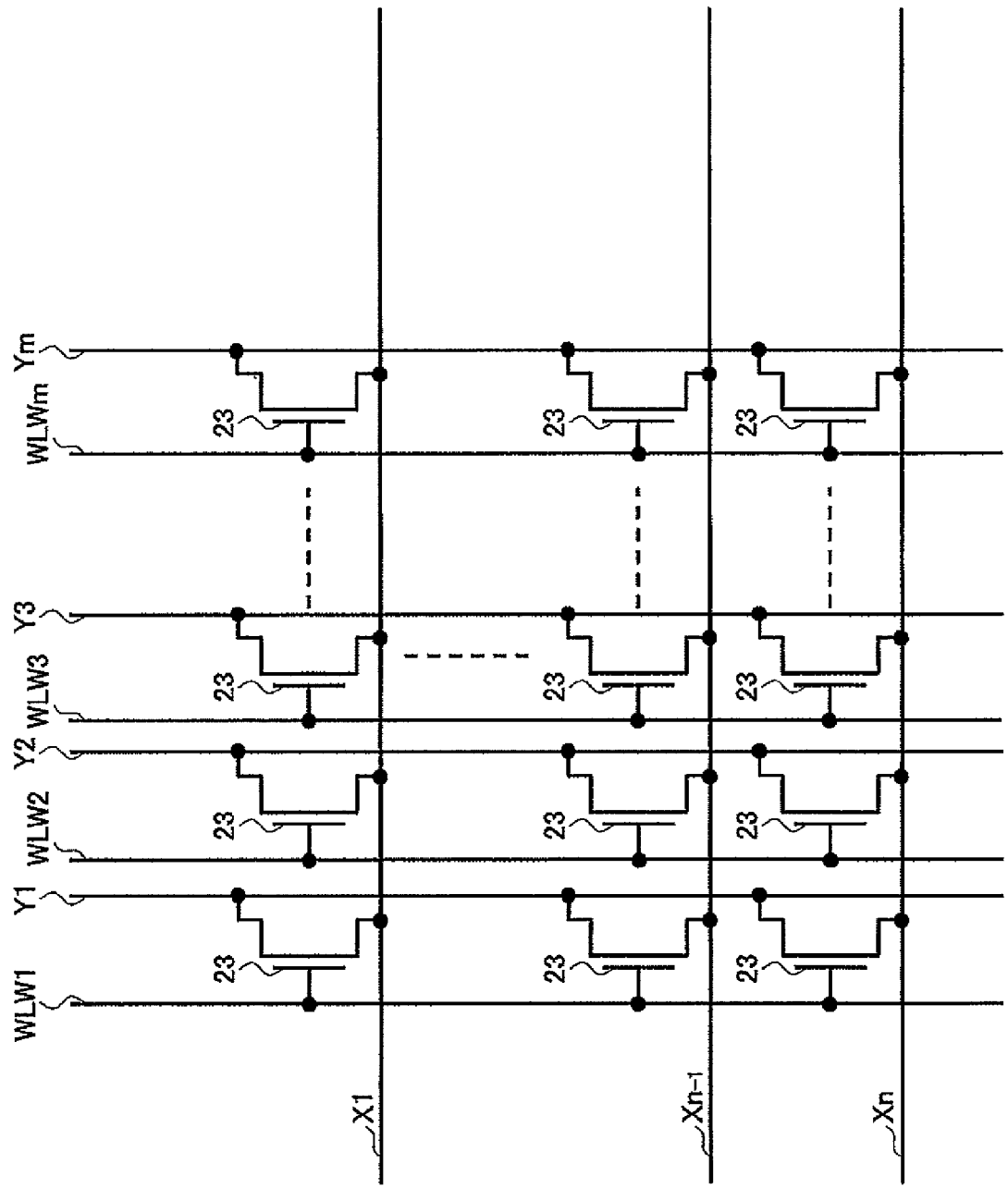
FIG. 8 is a drawing showing a memory cell array for use in a nonvolatile memory device.

FIG. 8 is a drawing showing a memory cell array for use in a nonvolatile memory device. In FIG. 8, a plurality of PMOS transistors 23 are arranged in matrix form. The size of the matrix is n×m (i.e., n rows and m columns). One end of the channel of a given PMOS transistor 23 is coupled to a corresponding bit line Yk (k=1, 2, . . . m), which extends in a first direction (e.g., vertical direction). The other end of the channel of this PMOS transistor 23 is coupled to a corresponding bit line Xl (l=1, 2, . . . n), which extends in a second direction (e.g., horizontal direction) substantially perpendicular to the first direction. The gate node of this PMOS transistor 23 is coupled to a corresponding word selecting line WLWk (l=1, 2, . . . , m), which extends in the first direction.

The bit line X, bit line Y, and word selecting line WLW shown in FIG. 7 correspond to one of the bit lines X1 through Xn, one of the bit lines Y1 through Ym, and one of the word selecting lines WLW1 through WLWm shown in FIG. 8. Provision may be made such that only a selected one of the bit lines Y1 through Ym is coupled via a switch to either the latch 25-1 or the plate line PL2, and such that only a selected one of the bit lines X1 through Xn is coupled via a switch to either the latch 25-2 or the plate line PL1. Selecting one of the bit lines Y1 through Ym and one of the bit lines X1 through Xn makes it possible to select one of the PMOS transistors 23 arranged in matrix form. The write operation as described by referring to FIG. 7 can write a three-level value to a selected one of the PMOS transistors 23 at a selected end node serving as the drain. The read operation as described by referring to FIG. 7 can read a three-level value from a selected one of the PMOS transistors 23 at a selected end node serving as the source.

Figure 9:
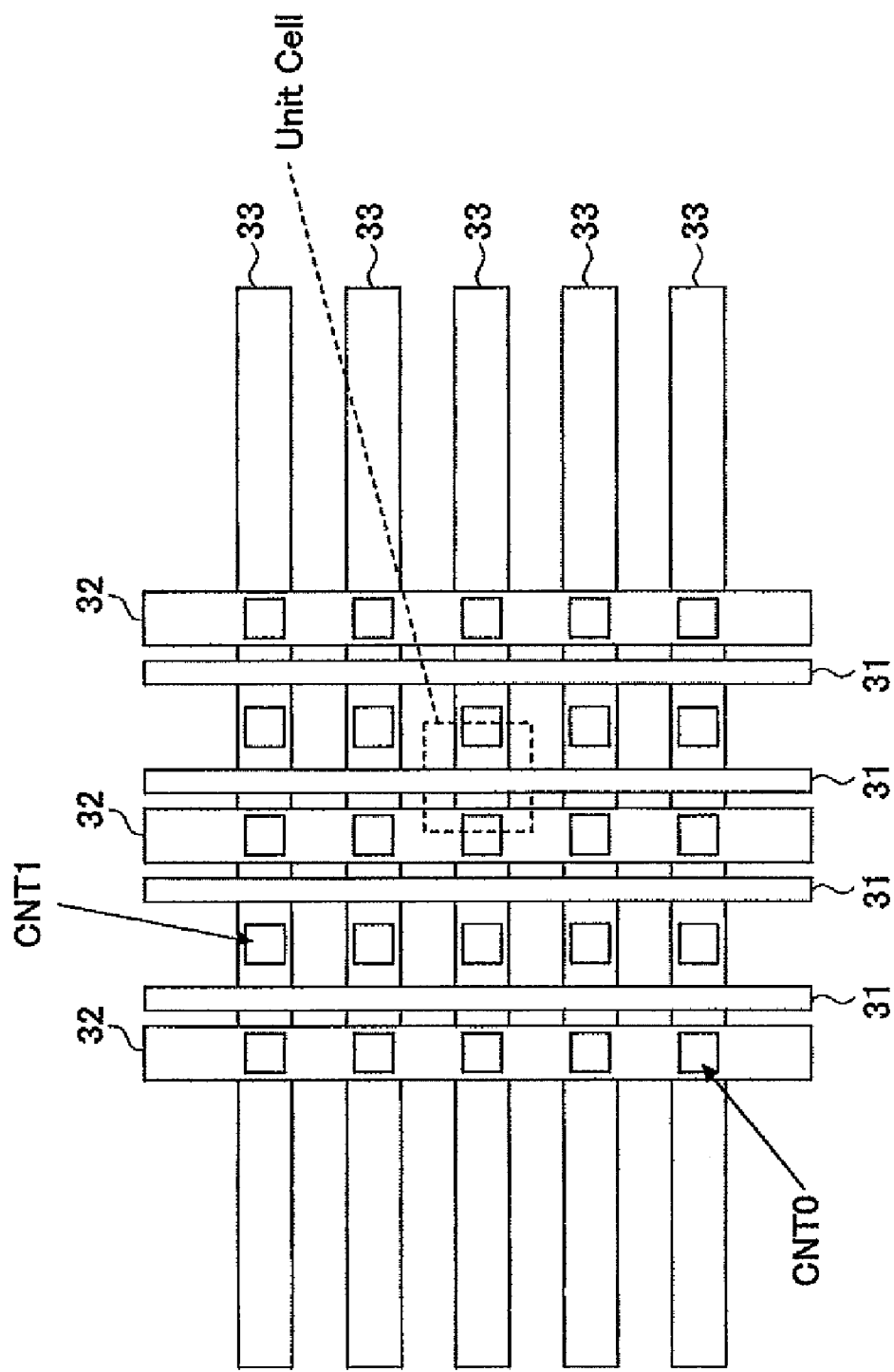
FIG. 9 is a drawing showing an example of the layout of the memory cell array shown in FIG. 8.

FIG. 9 is a drawing showing an example of the layout of the memory cell array shown in FIG. 8. Polysilicon gate electrodes 31 correspond to the word selecting lines WLW1 through WLWm shown in FIG. 8. Metal interconnects 33 arranged in a first metal layer correspond to the bit lines X1 through Xn shown in FIG. 8. Metal interconnects 32 arranged in a second metal layer correspond to the bit lines Y1 through Ym shown in FIG. 8. The positions of the metal interconnects 33 correspond to the positions of diffusion regions of the PMOS transistors 23. Namely, the metal interconnects 33 are disposed over the diffusion regions. Contacts CNT0 provide electrical couplings between the metal interconnects 32 and the diffusion regions. Contacts CNT1 provide electrical couplings between the metal interconnects 33 and the diffusion regions.

The size of a unit cell as illustrated in FIG. 9 is determined by the pitch of the diffusion regions (i.e., the pitch of the metal interconnects 33) in the vertical direction. The horizontal size of the unit cell is determined by the pitch between the contact CNT0 and the contact CNT1.

Figure 10:
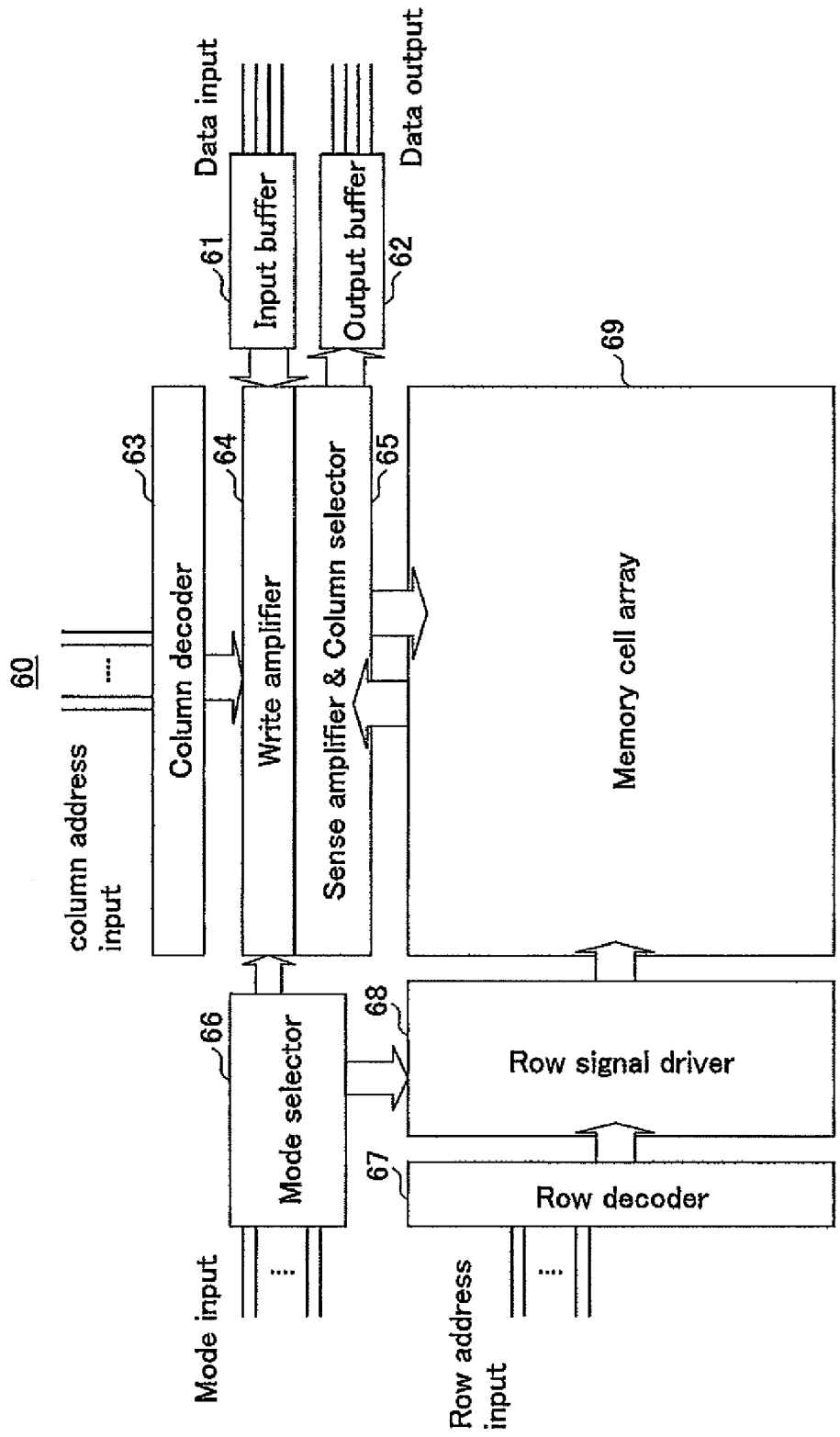
FIG. 10 is a block diagram showing the configuration of a nonvolatile semiconductor memory device.

FIG. 10 is a block diagram showing the configuration of a nonvolatile semiconductor memory device. A semiconductor memory device 60 shown in FIG. 10 includes an input buffet 61, an output buffer 62, a column decoder 63, a write amplifier 64, a sense amplifier & column selector 65, a mode selector 66, a row decoder 67, a row signal driver 68, and a memory cell array 69.

The memory cell array 69 includes a plurality of memory cells arranged in matrix form, each memory cell corresponding to the PMOS transistor 23 shown in FIG. 4. The memory cells arranged in the same column are connected to the same bit line, and the memory cells arranged in the same row are connected to the same word selecting line WLW.

The mode selector 66 receives mode input signals from an exterior of the device, and decodes the mode input signal to determine an operation mode (e.g., a write operation mode or a read operation mode). Control signals responsive to the determined operation mode are supplied to the write amplifier 64, the sense amplifier & column selector 65, the row signal driver 68, etc., for control of the individual parts of the semiconductor memory device 60.

The column decoder 63 receives a column address supplied from an external source situated outside the semiconductor memory device 60, and decodes the column address to determine a selected column. The decode signals indicative of the selected column are supplied to the write amplifier 64 and the sense amplifier & column selector 65.

The row decoder 67 receives a row address supplied from the external source, and decodes the row address to determine a selected row. The decode signals indicative of the selected row are supplied to the row signal driver 68.

In response to the control signals from the mode selector 66 and the decode signals from the row decoder 67, the row signal driver 68 activates a selected word selecting line and a selected plate line among the word selecting lines and plate lines extending from the row signal driver 68.

In response to the control signals from the mode selector 66 and the decode signals from the column decoder 63, the sense amplifier & column selector 65 couples a bit line corresponding to the selected column to a data bus. Through this coupling, data is transferred between the memory cell array 69 and the data bus. The sense amplifier & column selector 65 amplifies the data read from the memory cell array 69 for provision to the output buffer 62. The data is output from the output buffer 62 to outside the semiconductor memory device 60 as output data. Input data supplied to the input buffer 61 from an external source is provided to the write amplifier 64. The write amplifier 64 amplifies the input data to be written to the memory cell array 69.

Latches, each corresponding to the latch 25 shown in FIG. 4, are provided in the write amplifier 64 and/or the sense amplifier & column selector 65. Both a write operation and a read operation may utilize a common latch 25. Alternatively, a latch 25 provided in the write amplifier 64 may be used when writing data to a PMOS transistor 23r and another latch 25 provided in the sense amplifier & column selector 65 may be used when reading data.

In a case where a single bit corresponds to a single column, only a selected bit line may be coupled to a single latch 25. Alternatively, provision may be made such that a plurality of bits corresponds to a single column. In such a case, a plurality of bit lines may be coupled to respective latches 25, which may also be coupled to respective constant current sources 24. Each latch 25 thus senses data of a corresponding memory cell by use of a corresponding reference current.

As previously described, a logic circuit or controller may be provided to encode or transform two successive read bits obtained at the time of read operation or two successive write bits supplied at the time of write operation. Such a logic circuit or controller may be provided in the write amplifier 64 or in the sense amplifier & column selector 65.

The configuration shown in FIG. 10 is generally suitable to a memory cell array in which only one three-level value is stored in one MIS transistor. Alternatively, it may be desired to employ as the memory cell array 69 the memory cell array as shown in FIG. 8 that can store two three-level values in a single MIS transistor. In such a case, the functions of the write amplifier 64, the sense amplifier & column selector 65, and the row signal driver 68 may be consolidated into one control unit, and two such control units may be provided, one flanking the memory cell array 69 in the vertical direction and the other flanking the memory cell array 69 in the horizontal direction. The function to drive the word selecting lines may only be provided in the control circuit that flanks the memory cell array 69 in the vertical direction.

Further, the present invention is not limited to these embodiments, but various variations and modifications may be made without departing from the scope of the present invention.

What is claimed is:

1. A memory circuit, comprising:
    a latch having a first node and a second node to store data such that a logic level of the first node is an inverse of a logic level of the second node;
    a MIS transistor having a gate node, a first source/drain node, and a second source/drain node, the first source/drain node coupled to the first node of the latch; and
    a control circuit configured to control the gate node and second source/drain node of the MIS transistor to make an upward lingering change in a threshold voltage of the MIS transistor in a first operation in response to data stored in the latch and to make a downward lingering change in the threshold voltage in a second operation in response to data stored in the latch, the upward lingering change being a shift of the threshold voltage from an initial threshold in a first direction and the downward lingering change being a shift of the threshold voltage from the initial threshold in a second direction opposite the first direction.

2. The memory circuit as claimed in claim 1, wherein the MIS transistor stores three-level values corresponding to the upward lingering change, no change, and the downward lingering change in the threshold voltage.

3. The memory circuit as claimed in claim 1, wherein a logic level of the first node of the latch during the first operation controls whether the upward lingering change in the threshold voltage occurs, and a logic level of the first node of the latch during the second operation controls whether the downward lingering change in the threshold voltage occurs.

4. The memory circuit as claimed in claim 1, wherein the MIS transistor further includes an insulating film and sidewalls, and the control circuit is configured to make the upward lingering change in the threshold voltage by causing first carriers to be trapped in at least one of the insulating film and sidewalls in the first operation and to make the downward lingering change in the threshold voltage by causing second carriers to be trapped in at least one of the insulating film and sidewalls in the second operation, electrons being predominant in the first carriers and holes being predominant in the second carriers.

5. The memory circuit as claimed in claim 1, wherein the control circuit is configured to apply a first voltage to the gate node of the MIS transistor in the first operation and to apply a second voltage to the gate node of the MIS transistor in the second operation, the first voltage being different from the second voltage.

6. A memory circuit, comprising:
    a latch having a first node and a second node to store data such that a logic level of the first node is an inverse of a logic level of the second node;
    a MIS transistor having a gate node, a first source/drain node, and a second source/drain node, the first source/drain node coupled to the first node of the latch; and
    a control circuit configured to control the gate node and second source/drain node of the MIS transistor to make an upward lingering change in a threshold voltage of the MIS transistor in a first operation in response to data stored in the latch and to make a downward lingering change in the threshold voltage in a second operation in response to data stored in the latch, wherein the control circuit is further configured to control the gate node and second source/drain node of the MIS transistor in a third operation to cause the latch to store data responsive to a comparison between a drain current running through the MIS transistor and a reference current.

7. The memory circuit as claimed in claim 6, wherein the control circuit is further configured to perform the comparison twice with respect to two different reference currents.

8. A memory circuit, comprising:
    a latch having a first node and a second node to store data such that a logic level of the first node is an inverse of a logic level of the second node;
    a MIS transistor having a gate node, a first source/drain node, and a second source/drain node, the first source/drain node coupled to the first node of the latch;
    a control circuit configured to control the gate node and second source/drain node of the MIS transistor to make an upward lingering change in a threshold voltage of the MIS transistor in a first operation in response to data stored in the latch and to make a downward lingering change in the threshold voltage in a second operation in response to data stored in the latch; and
    switch circuits configured to change electrical connections for the first source/drain node and second source/drain node of the MIS transistor to provide a first connection mode and a second connection mode, such that the first source/drain node serves as a drain node during the first operation and second operation in the first connection mode while the second source/drain node serves as a drain node during the first operation and second operation in the second connection mode.

9. The memory circuit as claimed in claim 8, wherein the MIS transistor stores two three-level values including one stored in the first connection mode and another stored in the second connection mode, each of the two three-level values corresponding to the upward lingering change, no change, and the downward lingering change in the threshold voltage.

10. The memory circuit as claimed in claim 8, wherein the control circuit is further configured to control the gate node and second source/drain node of the MIS transistor in a third operation to cause the latch to store data responsive to a comparison between a drain current running through the MIS transistor and a reference current, and wherein the first source/drain node serves as a source node during the third operation in the first connection mode while the second source/drain node serves as a source node during the third operation in the second connection mode.

* * * * *